United States Patent [19]

Gordon

[11] 4,382,509

[45] May 10, 1983

[54] METHOD AND APPARATUS FOR ASSEMBLING, SHIPPING AND TESTING SENSITIVE ELECTRONIC COMPONENTS

[75] Inventor: Bertram I. Gordon, Baltimore, Md.

[73] Assignee: L. Gordon & Sons, Inc., Baltimore, Md.

[21] Appl. No.: 182,883

[22] Filed: Sep. 2, 1980

[51] Int. Cl.³ .................................. B65D 85/00
[52] U.S. Cl. ............................. 206/331; 206/334
[58] Field of Search ............... 206/328, 330, 331, 332, 206/334

[56] References Cited

U.S. PATENT DOCUMENTS 3,737,031  6/1973  Carroll ........................... 206/328
4,171,049 10/1979  Nohara et al. ................. 206/328
4,211,324  7/1980  Ohlbach ......................... 206/328

OTHER PUBLICATIONS

Advertisement–Republic Packaging Corporation.
Advertisement–Republic Packaging Corporation (ESDS) Conduit Carton.
Product Announcement–Carton Dissipates Static Charges.
Copy of Photograph.
IBM, vol. 17, #10, 3–1975

Primary Examiner—Joseph Man-Fu Moy
Attorney, Agent, or Firm—Howard L. Rose

[57] ABSTRACT

A container for handling small sensitive electronic components having lugs to which wires may be attached, is disclosed. The container is comprised of cardboard having a conductive metallic coating on a surface thereof. The container has a portion (i.e., a hump) on which the electronic components are securely placed so that the lugs are all electrically interconnected by said metallic coating. The fact that the coating interconnects all of the lugs, prevents build-up of static electricity which might injure the electronic component. The electronic components can be easily tested by removing the top portion of the container and by inserting non-conductive inserts between the portion of the container to which the electronic components are secured and the electronic components. Test probes can then be brought into contact with the electronic components. In manufacture, a base or lower part of a component's casing having rigid leads (lugs) depending downwardly is first positioned such that the lugs grip said hump. An integrated circuit is then assembled on the base. The lugs may continuously remain on the hump throughout the entire process of assembly, shipment to the customer, and testing by the manufacturer and customer.

11 Claims, 13 Drawing Figures

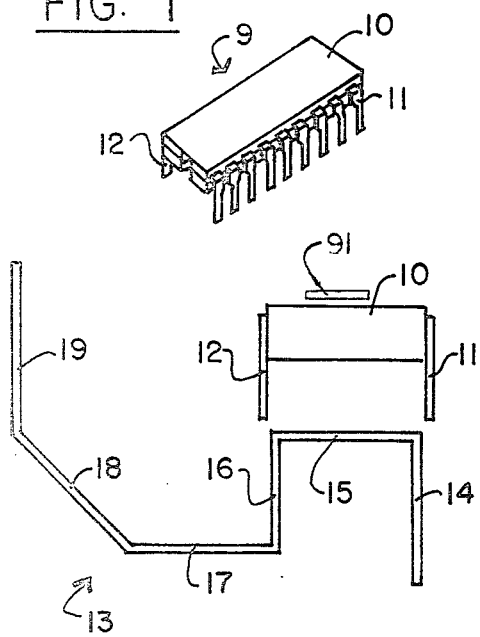
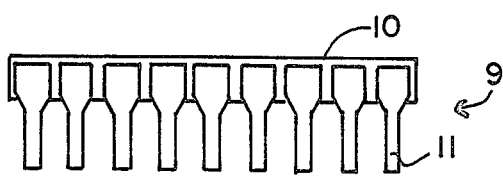
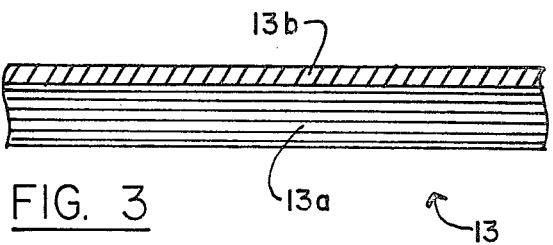
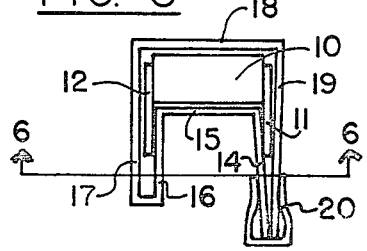
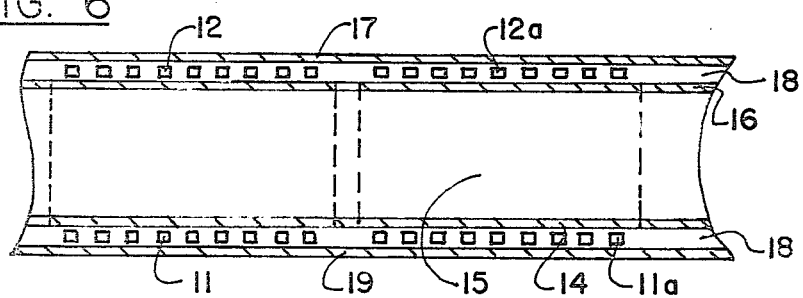
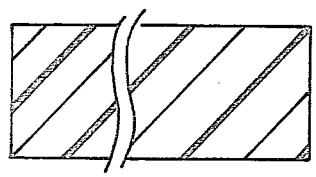
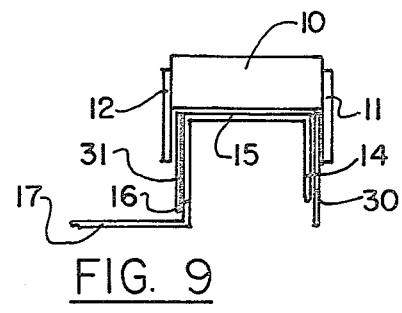

NOTE
IN FIGURES 12 & 13 ALL THE INTERIOR SURFACES OF THE BOX (40) ARE METAL COATED.

METHOD AND APPARATUS FOR ASSEMBLING, SHIPPING AND TESTING SENSITIVE ELECTRONIC COMPONENTS

This invention relates to a method of, and apparatus for, assembling, shipping and testing small electronic components. In particular, this invention discloses a container for handling small electronic components having means to prevent static electricity from developing across the lugs of the electronic components.

BACKGROUND OF THE INVENTION

Because of the great development which has taken place in the electronics industry in the last twenty years, there is a large demand for small electronic components such as integrated circuit chips. These components are manufactured by companies which specialize in this field and are then shipped to companies that incorporate such components into electronic equipment, such as computers. Each computer may require thousands of small electronic components, so as a general rule these small components are handled in mass.

Usually these components are produced on an assembly line. The components must be handled very carefully on the assembly line as they can be easily damaged in handling and/or by static electricity as discussed below.

The electronics of the components is so delicate that a relatively small build-up of electric potential difference between two lugs of the electronic components may destroy the electronic component. In fact, if these components are shipped in an ordinary cardboard container, the static electricity generated by the electronic components rubbing the packing may produce enough voltage to injure the electronics.

The mechanical delicacy of these components, particularly during manufacture, also introduces problems which must be provided for in manufacture and as a result of which testing must be conducted throughout the manufacturing process. Further, because these components are so susceptible to damage, it is often desired to test them upon their arrival at their destination. The purchaser of the components prefers to be able to test them as easily and as efficiently as possible without having to completely unpack them.

It is known in the art that coating the interior surface of the shipping carton with a conductive material reduces the static electricity build-up as discussed above; however, these known cartons are not susceptible for use during manufacture or with components having their external levels lying perpendicular to the plane of the components since such cartons cannot firmly engage the electronic components being handled and do not provide a means by which the components can be easily transported during manufacture and tested either during manufacture or thereafter.

SUMMARY OF THE INVENTION

This invention provides a container for handling small sensitive electronic components, such as components containing integrated circuit chips, that has a metallic coating and which firmly engages the components while the components are in the container. The container comprises a cardboard sheet or sheet of like material having a conductive metallic coating on one side thereof. The carton has a hump-like segment on which the component is placed. The carton is then folded over the top of the component such that the component is firmly encased between "the hump" of the carton and the portion of the carton folded over the top of the component.

In other embodiments of this invention, the container is a box, and "the hump" is located in the bottom of the box. The lid is then placed on the box to enclose the components and securely engages their top surfaces to retain them on the hump. All the interior surfaces of the box are coated with the conductive metallic coating.

The casings (including lugs) for the integrated circuit components may be first placed on "the hump" during the assembly process before the integrated circuit components are inserted in the casings and the casings are sealed. The casings stay on "the hump" throughout the rest of the assembly process while the chips are being completely assembled in the casings and the casings sealed.

The components may be easily tested without having to remove them from containers. The sides of "the hump" may be pressed toward each other either manually or by automatic machinery so that non-conductive inserts can be placed between the electronic components and "the hump" whereby the conducting elements of the components are no longer in any contact with "the hump." Probes may then be brought into contact with these conducting elements to test the components.

The completed components may be shipped while still on the same "humps" on which they were assembled. Stated differently, the components may be placed on a container for transport during the assembly process and are shipped via this same container without having to remove them at any time from this container. The purchaser may test the integrated circuit components while the casing is still on the "hump" using the test procedure described above.

IN THE DRAWINGS

FIG. 1 is a perspective view of an integrated circuit component which can be handled using this invention.

FIG. 2 is a side view of an integrated circuit component.

FIG. 3 is a partial side view illustrating the cardboard layer and metallic coating which comprise the container means of this invention.

FIG. 4 is an end view showing an integrated circuit component placed on a hump of a backing that has a metallic coating thereon.

FIG. 5 is an end view showing the backing and the casing in a form ready for shipment to a customer.

FIG. 6 is a bottom view of the assembly illustrated in FIG. 5 taken along section line 6—6 of FIG. 5.

FIG. 7 is an end view of an embodiment of a clip which can be employed to affix the ends of the assembly, illustrated in FIG. 5, together.

FIG. 8 is a side view of the end clip illustrated in FIG. 7.

FIG. 9 is an end view of the embodiment of this invention illustrated in FIGS. 4 to 6 illustrating how paper inserts can be inserted between the lugs of the integrated circuit component and the metallic coating (on the cardboard) to permit testing of the integrated circuit chip.

DETAILED DESCRIPTION OF THE DRAWINGS

Figure 10:
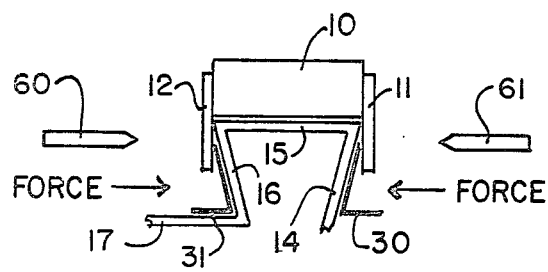
FIG. 10 is an end view showing how force is applied to an embodiment of this invention to insert the paper inserts.

Referring to the drawings, FIGS. 1–3 illustrate an electronic circuit component, 9, which has an integrated circuit chip 91 (see FIG. 4) encased therein. Electronic circuit component 9 is comprised of a casing 10 and a set of metallic connecting elements such as lugs 11 and 12 extending downward on each side of casing 10. Such a component 9 is shown preferably as a conventional dual in-line package (DIP), but may comprise other components.

Container 13 is a unitary piece of backing material such as cardboard 13a, having a thin coating 13b of a conductive material, such as a metal foil, on top thereof. In the embodiment illustrated in FIG. 4–6, container 13 is comprised of folds 14–19. Electronic circuit component 9 is placed on container 13 as shown in FIG. 4. Casing 10 is placed on fold 15 with lugs 11 extending downward past fold 15 and abutting fold 14 and with lugs 12 also extending downward past fold 15 and abutting fold 16. The remaining folds of container 13 are ultimately wrapped around electronic circuit component 9, as shown in FIG. 5. Preferably when electronic circuit component 9 is first placed in position on the hump 14, 15, 16 (FIG. 4) casing 10 is empty. An integrated circuit 91 is then incorporated in the casing 10 while the casing 10 is still on the hump 14, 15, 16. The circuit may then be tested while on the hump as described below.

Next, fold 17 is rotated until it abuts lugs 12 so that lugs 12 are disposed between fold 17 and fold 16. Fold 18 is then placed across the top of casing 10 such that casing 10 is sandwiched between fold 15 and fold 18. Next fold 19 is placed against lugs 11, sandwiching lugs 11 between fold 14 and fold 19.

To secure container 13 in this position, which is the shipping position, clip 20 is added on the ends of folds 14 and 19 as shown in FIG. 5. A type of elongated clip which can be used, is illustrated in FIGS. 7 and 8.

Figure 11:
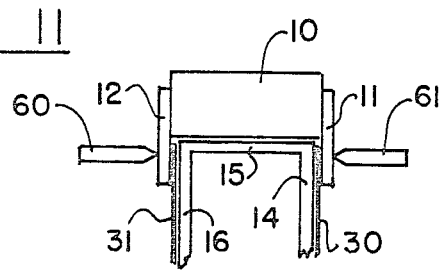
FIG. 11 is an end view illustrating a method of testing the components while the integrated circuit chips are still on the handling means.

When containers 13 arrive at the end of the production line or at their shipping destination, with the electronic circuit components 9 intact thereon, it may be desired that selected ones, or all, of the components be tested. One possible test procedure is illustrated in FIGS. 9–11.

In this procedure, clip 20 is first removed, then folds 17, 18, and 19 are unwrapped to expose electronic circuit components 9. Next, non-conductive means, such as paper inserts 30 and 31, are inserted between lugs 11 and fold 14, and lugs 12 and fold 16, respectively. Paper inserts 30 and 31 can be inserted by pressing the folds 14 and 16 inwardly, as shown by the arrows of FIG. 10, to create a gap between lugs 11 and fold 14, and a gap between lugs 12 and fold 16. Paper inserts 30 and 31 are then placed in these gaps. When the force is released, the elements will reach an equilibrium as shown in FIG. 11, and test probes 60 and 61 can be employed to test the integrated circuit 91 in casing 9.

As shown in FIG. 6, numerous electronic circuit components 9 can be mounted and shipped in one container 13.

Figure 12:
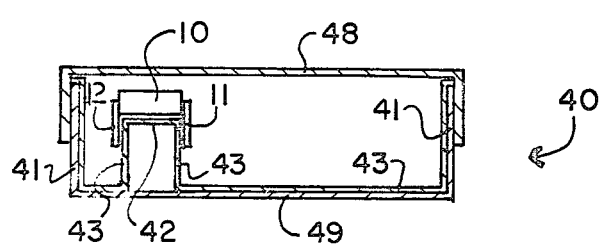
FIG. 12 is a sectionalized side view of another embodiment of this invention, this embodiment being a box for shipping electronic components.
Figure 13:
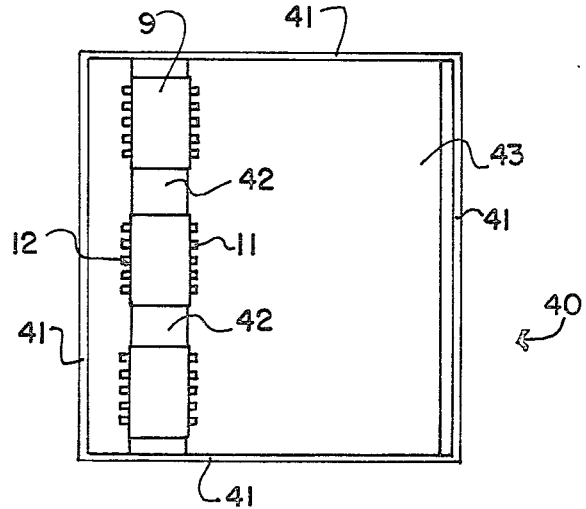
FIG. 13 is a top view of the embodiment illustrated in FIG. 12, with the box top being removed.

Another embodiment of this invention is illustrated in FIGS. 12 and 13. This embodiment comprises a box 40 having box top 48 and box bottom 49. Box 40 is comprised of the same material as container 13; therefore, the interior of box 40 is coated with conductive metallic coating 13b.

Lining 43 is placed inside of box bottom 49 and covers the entire interior of the box bottom. The lining 43 is glued to the bottom, and as required, to the sides 41 of box bottom 49. Lining 43 is comprised of a cardboard (or like material) layer and a conductive coating the same as container 13. Lining 43 is folded to form hump 42 as shown in FIG. 12. To ship electronic circuit components 9, the components 9 are placed on hump 42. When box top 48 is placed on box bottom 49, the conductive coatings of the top and bottom of the box are brought into contact; surrounding the electronic component with conductive material and thus providing a Faraday Cage. The top 48 may lightly engage the top of electronic circuit component 9 but in any event, is spaced from the top of the component 9 by a distance less than the length of lugs 11 and 12.

As shown in FIG. 13, numerous electronic circuit components 9 can be placed on one hump 42. Also, each box 40 may have more than one hump 42, to increase the shipping capacity of the box.

The preferred application of the invention is as follows. Initially, the component 9 is placed on the metal coated cardboard sheet 13, as shown in FIG. 4, before the component 9 is completely assembled. In other words, the component 9 is a mere casing 10 having projecting lugs 11 and 12; the casing 10 being empty. After the casing 10 of component 9 is mounted on folds 14, 15 and 16 with the lugs 11 and 12 in firm contact with the metal coating 13b on folds 14 and 16, the integrated circuit 91 is assembled in the casing 10 and the casing 10 is sealed. Usually a multiplicity of such circuit components 9 are assembled on folds 14, 15 and 16 before the next step is taken. That next step may be to test the components. Thereafter, the process of enclosing the circuit components 9 in the folds 14, 15, 16, 17, 18 and 19 as shown and described in connection with FIG. 5, is completed. The circuit components are now ready for shipment to the customer or ultimate user. They are shipped without removing them from their original position (mounted on the coated cardboard 13); thereby greatly reducing handling of the components during assembly, testing and shipping. Further, the customer or ultimate user may then test them as explained in connection with FIGS. 10 and/or 11.

In other words, once the naked casing 10 with lugs 11 and 12 is mounted on folds 14, 15, and 16, the circuit component remains intact on those folds during further assembly of component 9, during the closing of the container (FIG. 5), during shipment to the customer, and during testing by the customer (FIGS. 10 and/or 11).

The practice of this invention is not limited to containers for the electronic circuit components illustrated in the Figures. Containers could be designed according to this invention that could be used to transport any size or shape of electronic component.

Once given the above disclosure, other features, modifications, and improvements will become apparent to one skilled in the art. These features, modifications, and improvements are, therefore, considered to be within the scope of this invention as defined by the following claims:

I claim:

1. An electrical component of the type that has spaced sets of electrical connectors projecting therefrom and means for holding said component to prevent injury thereof, comprising.
    a bent piece of backing material having two surfaces of said material spaced apart about the same distance as the spacing between said sets of electrical connectors,
    said component being mounted on said backing material with said connectors in contact with said surfaces.
    said bent piece of backing material having conductive material located thereon such that said conductive material substantially eliminates build up of static electricity,
    said bends of said bent piece of backing material being so resilient and biasing wherein when said surfaces being pressed toward each other, the contact between said connectors and said surfaces being disconnected by insertion of a non-conductive material therebetween.

2. An electrical component and means for holding said component according to claim 1 wherein said electronic component is comprised of a casing,
    and wherein said spaced electrical connectors comprise two sets of lugs extending perpendicular to the plane of said casing.

3. An electrical component and means for holding said component according to claim 2 wherein said bent piece of backing material is comprised of two or more folds,
    wherein two of said folds abut the inside portions of said lugs when said electronic component is mounted on said backing material.

4. An electrical component and means for holding said component according to claim 3 wherein said backing material comprises a portion which is wrapped around the top of said electronic component to encase said component for shipping such that each of said lugs is sandwiched between said metallic coating.

5. An electrical component and means for holding said component according to claim 1 wherein said holding means comprises a box having engaging means located in the bottom thereof,
    said engaging means being coated with said conductive material coating, said electrical component being securely mounted on said holding means while said electrical component is being assembled and shipped.

6. An electrical component and means for holding said component according to claim 3 wherein:
    said component is mounted on three of said folds, said two of said folds being vertical when said electrical component is mounted on said means, and abut said sets of lugs, and a third of said folds connect said two folds and abuts the bottom of said casing.

7. A device according to claim 5 wherein said box has all interior surfaces coated with conductive material whereby to provide a Faraday Cage.

8. A device for holding electrical circuit components that have spaced sets of electrical connectors projecting therefrom, comprising,
    a bent piece of backing material having a distance about equal to the spacing of said sets of connectors,
    conductive material on said backing material for electrically interconnecting said sets of connectors,
    means including a third portion of said backing material for holding said components by said backing material and pressing said conductive material against said sets of connectors,
    said bent piece of backing material having conductive material located thereon such that said conductive material substantially eliminate build up of static electricity,
    said two portions of said bent piece of backing material being so resilient and biasing wherein when said two portions being pressed toward each other the contact between the conductive material and said connectors being disconnected by insertion of a non-conductive material therebetween.

9. A device according to claim 8 wherein said bent piece of backing material is comprised of a single sheet of cardboard folded into at least three folds,
    said two portions comprising two of said folds.

10. A device according to claim 9 wherein said spaced sets of electrical connects are sets of lugs projecting downward,
    said two portions being joined by a third fold,
    said two portions and said third fold comprising engaging means being designed and arranged such that said components can be securely mounted thereon.

11. A device according to claim 10 wherein said third portion is comprised of more than one fold which can be wrapped around said components.

* * * * *